US009311909B2

(12) United States Patent
Giaimo, III et al.

(10) Patent No.: US 9,311,909 B2
(45) Date of Patent: Apr. 12, 2016

(54) SENSED SOUND LEVEL BASED FAN SPEED ADJUSTMENT

(71) Applicant: Microsoft Technology Licensing, LLC, Redmond, WA (US)

(72) Inventors: Edward C. Giaimo, III, Bellevue, WA (US); Yi He, Issaquah, WA (US); Duane Martin Evans, Snohomish, WA (US); Andrew D. Delano, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 601 days.

(21) Appl. No.: 13/631,308

(22) Filed: Sep. 28, 2012

(65) Prior Publication Data

US 2014/0094973 A1    Apr. 3, 2014

(51) Int. Cl.
| | |
|---|---|
| *G10K 11/16* | (2006.01) |
| *G01H 3/10* | (2006.01) |
| *G06F 1/20* | (2006.01) |
| *H04R 3/02* | (2006.01) |
| *H05K 7/20* | (2006.01) |
| *G06F 3/16* | (2006.01) |
| *H04R 27/00* | (2006.01) |
| *F01P 11/12* | (2006.01) |

(52) U.S. Cl.
CPC ............... *G10K 11/16* (2013.01); *G01H 3/10* (2013.01); *G06F 1/20* (2013.01); *G06F 3/165* (2013.01); *H04R 3/02* (2013.01); *H05K 7/20836* (2013.01); *F01P 11/12* (2013.01); *H04R 27/00* (2013.01); *H04R 2227/003* (2013.01); *H04R 2420/07* (2013.01)

(58) Field of Classification Search
USPC ........................................................ 700/280
See application file for complete search history.

(56) References Cited

U.S. PATENT DOCUMENTS

| | | | |
|---|---|---|---|
| 4,860,361 | A | 8/1989 | Sato et al. |
| 5,455,458 | A | 10/1995 | Quon et al. |
| 5,579,830 | A | 12/1996 | Giammaruti |
| 5,651,414 | A | 7/1997 | Suzuki et al. |
| 5,737,171 | A | 4/1998 | Buller et al. |
| 6,082,623 | A | 7/2000 | Chang |
| 6,226,178 | B1 | 5/2001 | Broder et al. |

(Continued)

FOREIGN PATENT DOCUMENTS

| | | |
|---|---|---|
| CN | 1469700 | 1/2004 |
| CN | 101193535 | 6/2008 |

(Continued)

OTHER PUBLICATIONS

"Foreign Notice of Allowance", Chinese Application No. 201320034345.X, (Aug. 14, 2013), 2 Pages.

(Continued)

*Primary Examiner* — Carlos Ortiz Rodriguez

(74) *Attorney, Agent, or Firm* — Jeremy Snodgrass; Judy Yee; Micky Minhas

(57) ABSTRACT

Sounds sensed by a microphone of a device include sounds from a cooling fan of the device that varies based on the speed of the cooling fan, and other sounds used by a program of the device such as voice inputs. The sound level of sounds used by the program is determined, and the speed of the fan is adjusted so that a desired cooling level is attained while keeping the fan speed low enough that the noise from the fan does not interfere with the sounds used by the program.

21 Claims, 4 Drawing Sheets

(56) References Cited

U.S. PATENT DOCUMENTS

| | | |
|---|---|---|
| 6,239,502 B1 | 5/2001 | Grewe et al. |
| 6,307,142 B1 | 10/2001 | Allen et al. |
| 6,411,512 B1 | 6/2002 | Mankaruse et al. |
| 6,446,442 B1 | 9/2002 | Batchelor et al. |
| 6,470,289 B1 | 10/2002 | Peters et al. |
| 6,621,702 B2 | 9/2003 | Elias et al. |
| 6,631,755 B1 | 10/2003 | Kung et al. |
| 6,635,999 B2 | 10/2003 | Belliveau |
| 6,702,003 B2 | 3/2004 | Hsiao et al. |
| 6,712,129 B1 | 3/2004 | Lee |
| 6,735,499 B2 | 5/2004 | Ohki et al. |
| 6,804,115 B2 | 10/2004 | Lai |
| 6,809,925 B2 | 10/2004 | Belady et al. |
| 6,889,755 B2 | 5/2005 | Zuo et al. |
| 6,906,901 B1 | 6/2005 | Liu |
| 6,971,443 B2 | 12/2005 | Kung et al. |
| 6,997,241 B2 | 2/2006 | Chou et al. |
| 7,069,975 B1 | 7/2006 | Haws et al. |
| 7,113,605 B2 | 9/2006 | Rui et al. |
| 7,116,555 B2 | 10/2006 | Kamath et al. |
| 7,191,820 B2 | 3/2007 | Chou et al. |
| 7,277,282 B2 | 10/2007 | Tate |
| 7,337,018 B2 | 2/2008 | Espinoza-Ibarra et al. |
| 7,376,852 B2 | 5/2008 | Edwards |
| 7,412,306 B2 | 8/2008 | Katoh et al. |
| 7,416,017 B2 | 8/2008 | Haws et al. |
| 7,455,102 B2 | 11/2008 | Cheng |
| 7,505,269 B1 | 3/2009 | Cosley et al. |
| 7,619,895 B1 | 11/2009 | Wertz et al. |
| 7,631,687 B2 | 12/2009 | Yang |
| 7,646,606 B2 | 1/2010 | Rytka et al. |
| 7,693,292 B1 * | 4/2010 | Gross et al. ............... 381/71.14 |
| 7,701,716 B2 | 4/2010 | Blanco, Jr. et al. |
| 7,843,691 B2 | 11/2010 | Reichert et al. |
| 7,894,613 B1 | 2/2011 | Ong et al. |
| 7,903,409 B2 | 3/2011 | Patel et al. |
| 7,941,231 B1 | 5/2011 | Dunn |
| 8,046,616 B2 | 10/2011 | Edwards |
| 8,061,411 B2 | 11/2011 | Xu et al. |
| 8,085,948 B2 | 12/2011 | Thomas et al. |
| 8,233,273 B2 | 7/2012 | Chen et al. |
| 8,274,614 B2 | 9/2012 | Yokote et al. |
| 8,392,035 B2 | 3/2013 | Patel et al. |
| 8,395,898 B1 | 3/2013 | Chamseddine et al. |
| 8,482,920 B2 | 7/2013 | Tissot et al. |
| 8,712,598 B2 | 4/2014 | Dighde et al. |
| 8,823,531 B1 | 9/2014 | McCleary et al. |
| 8,909,384 B1 | 12/2014 | Beitelmal et al. |
| 8,934,235 B2 | 1/2015 | Rubenstein et al. |
| 2002/0097558 A1 | 7/2002 | Stone et al. |
| 2003/0000689 A1 | 1/2003 | Kuo et al. |
| 2003/0023889 A1 | 1/2003 | Hofstee et al. |
| 2004/0011503 A1 | 1/2004 | Kung et al. |
| 2004/0267990 A1 | 12/2004 | Lin |
| 2005/0174737 A1 | 8/2005 | Meir |
| 2005/0207120 A1 | 9/2005 | Tseng et al. |
| 2006/0032616 A1 | 2/2006 | Yang |
| 2006/0118280 A1 | 6/2006 | Liu |
| 2006/0196643 A1 | 9/2006 | Hata et al. |
| 2007/0100494 A1 | 5/2007 | Patel et al. |
| 2007/0284093 A1 | 12/2007 | Bhatti et al. |
| 2008/0043425 A1 | 2/2008 | Hebert et al. |
| 2008/0141681 A1 | 6/2008 | Arnold |
| 2009/0002939 A1 | 1/2009 | Baugh et al. |
| 2009/0021908 A1 | 1/2009 | Patel et al. |
| 2009/0084525 A1 | 4/2009 | Satou et al. |
| 2009/0092261 A1 | 4/2009 | Bard |
| 2009/0180250 A1 | 7/2009 | Holling et al. |
| 2009/0195756 A1 | 8/2009 | Li et al. |
| 2009/0222147 A1 | 9/2009 | Nakashima et al. |
| 2010/0195280 A1 | 8/2010 | Huang et al. |
| 2010/0220439 A1 | 9/2010 | Qin |
| 2010/0259889 A1 | 10/2010 | Chen et al. |
| 2010/0300654 A1 | 12/2010 | Edwards |
| 2010/0315781 A1 | 12/2010 | Agostini |
| 2011/0025605 A1 | 2/2011 | Kwitek |
| 2011/0063795 A1 | 3/2011 | Yeh et al. |
| 2011/0127024 A1 | 6/2011 | Patel et al. |
| 2011/0134645 A1 | 6/2011 | Hitchcock et al. |
| 2011/0222236 A1 | 9/2011 | Luo et al. |
| 2011/0242757 A1 | 10/2011 | Tracy et al. |
| 2011/0310312 A1 | 12/2011 | Yokote et al. |
| 2012/0111544 A1 | 5/2012 | Senatori |
| 2012/0182687 A1 | 7/2012 | Dighde et al. |
| 2012/0206880 A1 | 8/2012 | Andres et al. |
| 2013/0000871 A1 | 1/2013 | Olson et al. |
| 2013/0081779 A1 | 4/2013 | Liao et al. |
| 2013/0186596 A1 | 7/2013 | Rubenstein |
| 2013/0186598 A1 | 7/2013 | Rubenstein |
| 2013/0294030 A1 | 11/2013 | Wang et al. |
| 2013/0332159 A1 * | 12/2013 | Federighi et al. ............. 704/235 |
| 2014/0041827 A1 | 2/2014 | Giaimo |

FOREIGN PATENT DOCUMENTS

| | | |
|---|---|---|
| CN | 101917835 | 12/2010 |
| EP | 1391673 | 8/2003 |
| EP | 1482396 | 3/2004 |
| EP | 1494109 | 1/2005 |
| WO | WO-2008021504 | 2/2008 |
| WO | WO-2009077601 | 6/2009 |
| WO | WO-2009143330 | 11/2009 |
| WO | WO-2011090455 | 7/2011 |

OTHER PUBLICATIONS

"Restriction Requirement", U.S. Appl. No. 13/355,836, (Sep. 27, 2013), 6 pages.

Aron, Jacob "'Sprinting' chips could push phones to the speed limit", *New Scientist*, Feb. 20, 2012, Issue #2852, (Feb. 20, 2012), 2 pages.

Chirgwin, Richard "Researchers propose 'overclock' scheme for mobiles—Processing at a sprint to overcome tech limitations", *The Register*, Feb. 21, 2012, 2 pages.

Coldewey, Devin "Researchers Propose "Computational Sprinting" To Speed Up Second Chips by 1000%—But Only for a Second", *TechCrunch*, Feb. 28, 2012, (Feb. 29, 2012), 2 pages.

Greenemeier, Larry "Could "Computational Sprinting" Speed Up Smart Phones without Burning Them Out?", *Scientific American*, Feb. 29, 2012, 2 pages.

Lerner, Evan "Penn Helps Rethink Smartphone Design With 'Computational Sprinting'", *Penn News Release*, (Feb. 28, 2012), 2 pages.

McMillan, Robert "Your Future iPhone May Be Stuffed With Wax", (Aug. 23, 2013), 3 pages.

Moore, Nicole C., "Computational sprinting pushes smartphones till they're tired", *Michigan News Release*, (Feb. 28, 2012), 2 pages.

Owano, Nancy "Study explores computing bursts for smartphones", PhysOrg.com, Feb. 21, 2012, 2 pages.

Papaefthymiou, Marios et al., "Computational Sprinting on a Hardware/Software Testbed", *In the Proceedings of the 18th Eighteenth International Conference on Architectural Support for Programming Languages and Operating Systems (ASPLOS)*, Mar. 2013., 12 pages.

Patrizio, Andy "Researchers Working on Ways to Put 16-Core Processors in Smartphones", *Brighthand*, Mar. 18, 2012, 2 pages.

Raghavan, Arun et al., "Computational Sprinting", *In the Proceedings of the 18th Symposium on High Performance Computer Architecture (HPCA)*, Feb. 2012, 12 pages.

Raghavan, Arun et al., "Designing for Responsiveness With Computational Sprinting", *IEEE Micro's "Top Picks of 2012" Issue*, (May 2013), 8 pages.

"Final Office Action", U.S. Appl. No. 13/355,914, Jun. 19, 2014, 11 pages.

"International Search Report and Written Opinion", Application No. PCT/US2013/061225, Jun. 4, 2014, 12 pages.

"Notice of Allowance", U.S. Appl. No. 13/355,836, Jun. 13, 2014, 11 pages.

"Corrected Notice of Allowance", U.S. Appl. No. 13/355,836, Sep. 11, 2014, 2 pages.

"Corrected Notice of Allowance", U.S. Appl. No. 13/355,836, Dec. 15, 2014, 2 pages.

(56) References Cited

OTHER PUBLICATIONS

"Non-Final Office Action", U.S. Appl. No. 13/355,914, Oct. 28, 2014, 18 pages.
"Notice of Allowance", U.S. Appl. No. 13/355,836, Oct. 8, 2014, 11 pages.
"Restriction Requirement", U.S. Appl. No. 13/570,073, Nov. 18, 2014, 7 pages.
"Written Opinion", Application No. PCT/US2013/061225, Oct. 10, 2014, 6 Pages.
"International Search Report and Written Opinion", Application No. PCT/US2013/053676, Oct. 16, 2013, 10 pages.
"Non-Final Office Action", U.S. Appl. No. 13/355,836, Nov. 4, 2013, 15 pages.
"PCT Search Report and Written Opinion", Application No. PCT/US2013/021784, (Apr. 30, 2013), 9 pages.
"PCT Search Report and Written Opinion", Application No. PCT/US2013/021783, (May 15, 2013), 9 pages.
"Non-Final Office Action", U.S. Appl. No. 13/355,914, Feb. 14, 2014, 10 pages.
"Final Office Action", U.S. Appl. No. 13/355,836, Mar. 10, 2014, 18 pages.
Man, Kaleen et al., "IT Equipment Noise Emission Standards: Overview of New Development in the Next Edition of ISO/ECMA Standards", *In Proceedings of 37th International Congress and Exposition on Noise Control Engineering*, Available at <http://www.ecma-international.org/activities/Acoustics/Internoise%202008%20paper%20on%20ECMA-74%20updates.pdf >,(Oct. 26, 2008), 8 pages.
Barger, Walt "COTS Cooling", *Publication of the National Electronics Manufacturing Center of Excellence*, Retrieved from: <http://www.empf.org/empfasis/2009/Oct09/cots.html > on Jul. 9, 2012,(Oct. 2009), 4 pages.
Baxtor, Shane "TwinTech GeForce GTS 250 XT OC 1GB Graphics Card", retrieved from <http://www.tweaktown.com/reviews/2733/twintech_geforce_gts_250_xt_oc_1gb_graphics_card/index3.html> on Dec. 30, 2011,(Apr. 24, 2009), 4 pages.
Jaworski, M. et al., "A Novel Design of Heat Sink with PCM for Electronics Cooling", *10th International Conference on Thermal Energy Storage*, Stockton, May 31-Jun. 2, 2006, retrieved from <https://intraweb.stockton.edu/eyos/energy_studies/content/docs/FINAL_PRESENTATIONS/4b-6%20.pdf> on Jan. 5, 2012,(May 31, 2006), 8 pages.
Krishnan, Shankar et al., "A Novel Hybrid Heat Sink Using Phase Change Materials for Transient Thermal Management of Electronics", *IEEE transactions on components and packaging technologies*, vol. 28, No. 2, retrieved from <http://ieeexplore.ieee.org/stamp/stamp.jsp?tp=&arnumber=1432936> on Jan. 5, 2012,(Jun. 2005), pp. 281-289.
Nguyen, Thang et al., "Advanced Cooling System Using Miniature Heat Pipes in Mobile PC", *IEEE Transactions on Components and Packaging Technology*, vol. 23, No. 1, Available at <http://ieeexplore.ieee.org/stamp/stamp.jsp?tp=&arnumber=833046&userType=inst>,(Mar. 2000), pp. 86-90.
Stupar, Andrija et al., "Optimization of Phase Change Material Heat Sinks for Low Duty Cycle High Peak Load Power Supplies", *IEEE transactions on components, packaging and manufacturing technology*, retrieved from <http://ieeexplore.ieee.org/stamp/stamp.jsp?tp=&arnumber=6081913> on Jan. 5, 2012,(Nov. 15, 2011), 14 pages.
Tari, Ilker et al., "CFD Analyses of a Notebook Computer Thermal Management System and a Proposed Passive Cooling Alternative", *IEEE Transactions on Components and Packaging Technologies*, vol. 33, No. 2, retrieved from <http://ieeexplore.ieee.org/stamp/stamp.jsp?tp=&arnumber=5466211> on Dec. 30, 2011,(Jun. 2010), pp. 443-452.
Walker, Tony "Thermalright Ultra-120 Extreme CPU Cooler", retrieved from <http://www.pro-clockers.com/cooling/66-thermalright-ultra-120-extreme-cpu-cooler.html> on Dec. 30, 2011,(Jul. 2, 2009), 7 pages.
"Final Office Action", U.S. Appl. No. 13/355,914, Feb. 23, 2015, 21 pages.
"Final Office Action", U.S. Appl. No. 13/570,073, Apr. 7, 2015, 7 pages.
"Non-Final Office Action", U.S. Appl. No. 13/570,073, Jan. 23, 2015, 7 pages.
"Extended European Search Report", EP Application No. 13741406.6, Aug. 21, 2015, 7 pages.
"Foreign Office Action(Need Translation)", CN Application No. 201310024146.5, Sep. 6, 2015, 11 pages.
"Non-Final Office Action", U.S. Appl. No. 13/355,914, Jun. 2, 2015, 19 pages.
"Non-Final Office Action", U.S. Appl. No. 13/570,073, Jul. 13, 2015, 10 pages.
"Final Office Action", U.S. Appl. No. 13/355,914, Oct. 19, 2015, 17 pages.
"Final Office Action", U.S. Appl. No. 13/570,073, Nov. 12, 2015, 9 pages.
"Non-Final Office Action", U.S. Appl. No. 13/355,914, Feb. 17, 2016, 18 pages.

\* cited by examiner

SENSED SOUND LEVEL BASED FAN SPEED ADJUSTMENT

BACKGROUND

As computing technology has advanced, the processing power of computing components, the number of computing components, and the density of computing components per unit volume in computers has increased. Along with such increases has also been an increase in the amount of heat generated by these components. Cooling fans have thus typically been included in computers to reduce the temperature of the computers. While these fans help keep computers and the computing components cooler, they are not without their problems. One such problem is that cooling fans can oftentimes generate a significant amount of noise, which can result in a frustrating and unfriendly user experience.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with one or more aspects, a sound level of sounds sensed by a microphone is detected. These sounds include a particular range of frequencies used by a program of the device, and also include the audio inputs for the program. A sound level of a fan of the device at a current fan speed is determined, and a speed of the fan is adjusted so that the sound level of the fan is less than a sound level sensed by the microphone that is attributable to sounds other than fan noise.

In accordance with one or more aspects, a system in a device includes a microphone, a fan motor, and a difference logic. The microphone detects sounds in a particular range of frequencies used by a program of the device. The fan motor controls, based on an input voltage, a speed of a fan of the device. The difference logic is coupled to receive audio data including the sounds detected by the microphone in the particular range of frequencies and determines, based on a sound level of the sounds detected by the microphone and a sound level generated by a fan of the device at a current fan speed, a voltage to apply to the fan motor so that a sound level generated by the fan is less than a sound level sensed by the microphone of sounds other than fan noise.

BRIEF DESCRIPTION OF THE DRAWINGS

The same numbers are used throughout the drawings to reference like features.

DETAILED DESCRIPTION

Sensed sound level based fan speed adjustment is discussed herein. The sounds sensed by a microphone of a device include sounds from a cooling fan of the device, the sound level of which varies based on the speed of the cooling fan. The sounds sensed by the microphone also include other sounds used by a program of the device, such as voice inputs. The sound level of sounds in one or more frequency ranges used by the program is determined, and the speed of the fan is adjusted so that a desired cooling level is attained while keeping the fan speed low enough that the noise from the fan does not interfere with the sounds used by the program (e.g., keeping the fan speed low enough that the sound level of the fan does not exceed the sound level attributable to other non-fan sounds).

Figure 1:
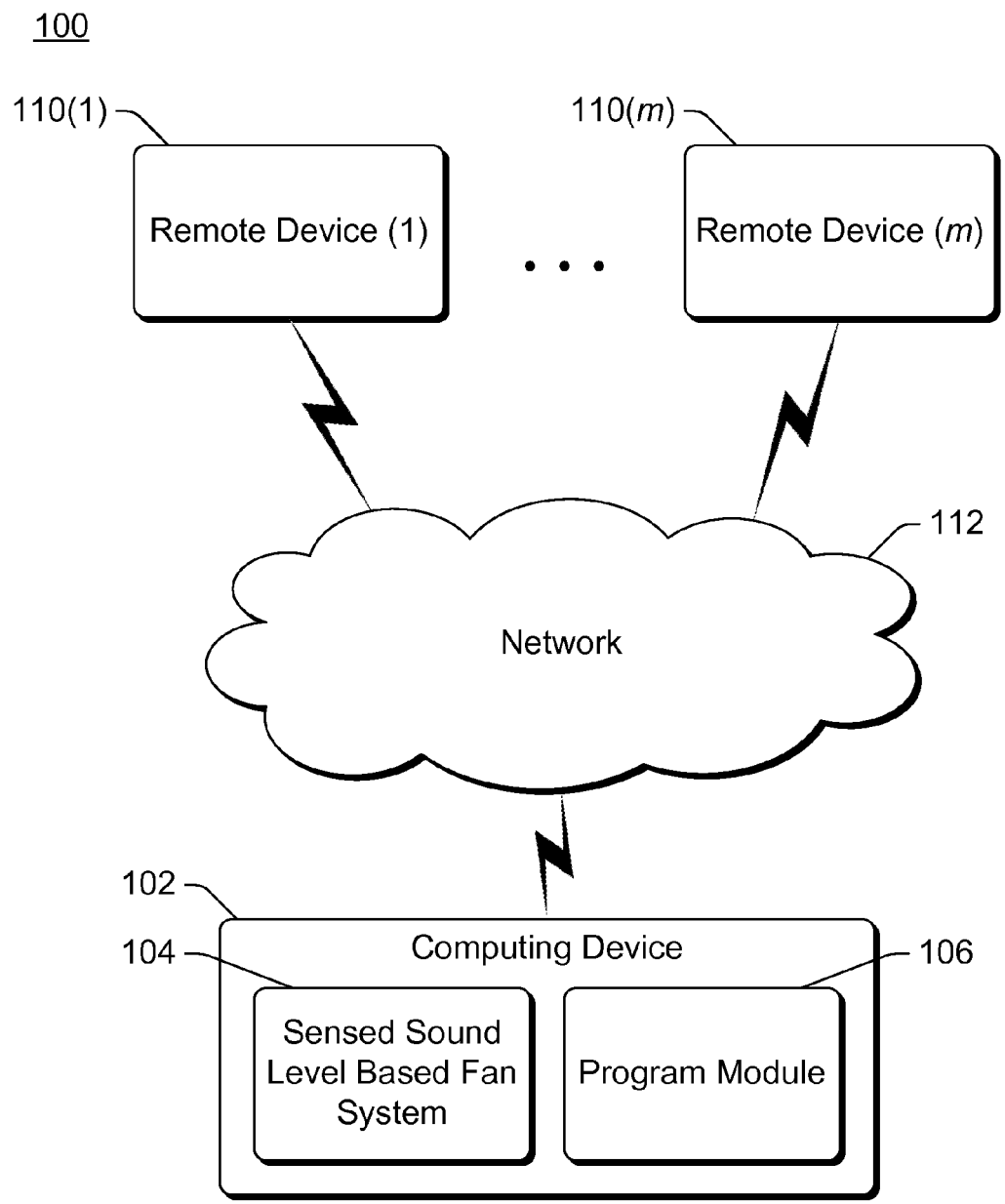
FIG. 1 illustrates an example system implementing the sensed sound level based fan speed adjustment in accordance with one or more embodiments.

FIG. 1 illustrates an example system 100 implementing the sensed sound level based fan speed adjustment in accordance with one or more embodiments. System 100 includes a computing device 102, which can be any of a variety of different types of devices. For example, computing device 102 can be a desktop computer, a server computer, a laptop or netbook computer, a tablet or notepad computer, a mobile station, an entertainment appliance, a set-top box communicatively coupled to a display device, a television or other display device, a cellular or other wireless phone, a game console, an automotive computer, and so forth. Thus, computing device 102 may range from full resource devices with substantial memory and processor resources (e.g., personal computers, game consoles) to low-resource devices with limited memory and/or processing resources (e.g., traditional set-top boxes, hand-held game consoles).

Computing device 102 includes a sensed sound level based fan system 104, and a program module 106. Program module 106 can be implemented in software, firmware, and/or hardware, and can provide any of a variety of different functionality that uses sounds input to computing device 102. These sounds can be used in various manners, such as recording the sounds, communicating the sounds to one or more other devices, manipulating or otherwise processing the sounds, combinations thereof, and so forth.

Fan system 104 includes a cooling fan that operates at various speeds to reduce the temperature of various components of computing device 102. Different fan speeds are associated with different fan sound levels, with faster fan speeds typically being associated with higher fan sound levels than slower fan speeds. Fan system 104 determines the sound level of sounds sensed at computing device 102, and adjusts the fan speed so that the desired cooling level is attained while keeping the fan speed low enough that the noise from the fan does not interfere with the sounds used by program module 106 (e.g., keeping the fan speed low enough so that the sound level of the fan does not exceed the sound level attributable to other non-fan sounds). For example, if a user of computing device 102 is speaking into a microphone of device 102 and the speech is the sound input to program module 106, then fan system 104 adjusts the fan speed so that the sound level of the fan is less than the sound level of the user's speech.

Computing device 102 can optionally communicate with one or more (m) remote devices 110 via a network 112. Network 112 can be a variety of different networks, including the Internet, a local area network (LAN), a phone network, an intranet, other public and/or proprietary networks, combinations thereof, and so forth.

Remote devices 110 can be any of a variety of different computing devices capable of communicating with computing device 102. Similar to the discussion of computing device 102, remote devices can be a variety of different devices, ranging from full resource devices with substantial memory and processor resources to low-resource devices with limited memory and/or processing resources. For example, remote devices 110 may provide audio and/or video conferencing functionality that allows audio and/or video conferences to be established between the remote device 110 and computing device 102 (e.g., program module 106).

Although discussed herein with reference to cooling fans, it should be noted that the techniques discussed herein can alternatively be used with other types of cooling systems other than cooling fans. The techniques discussed herein can be used analogously for any other type of cooling system that results in different sound levels at different settings (e.g., different speeds).

Figure 2:
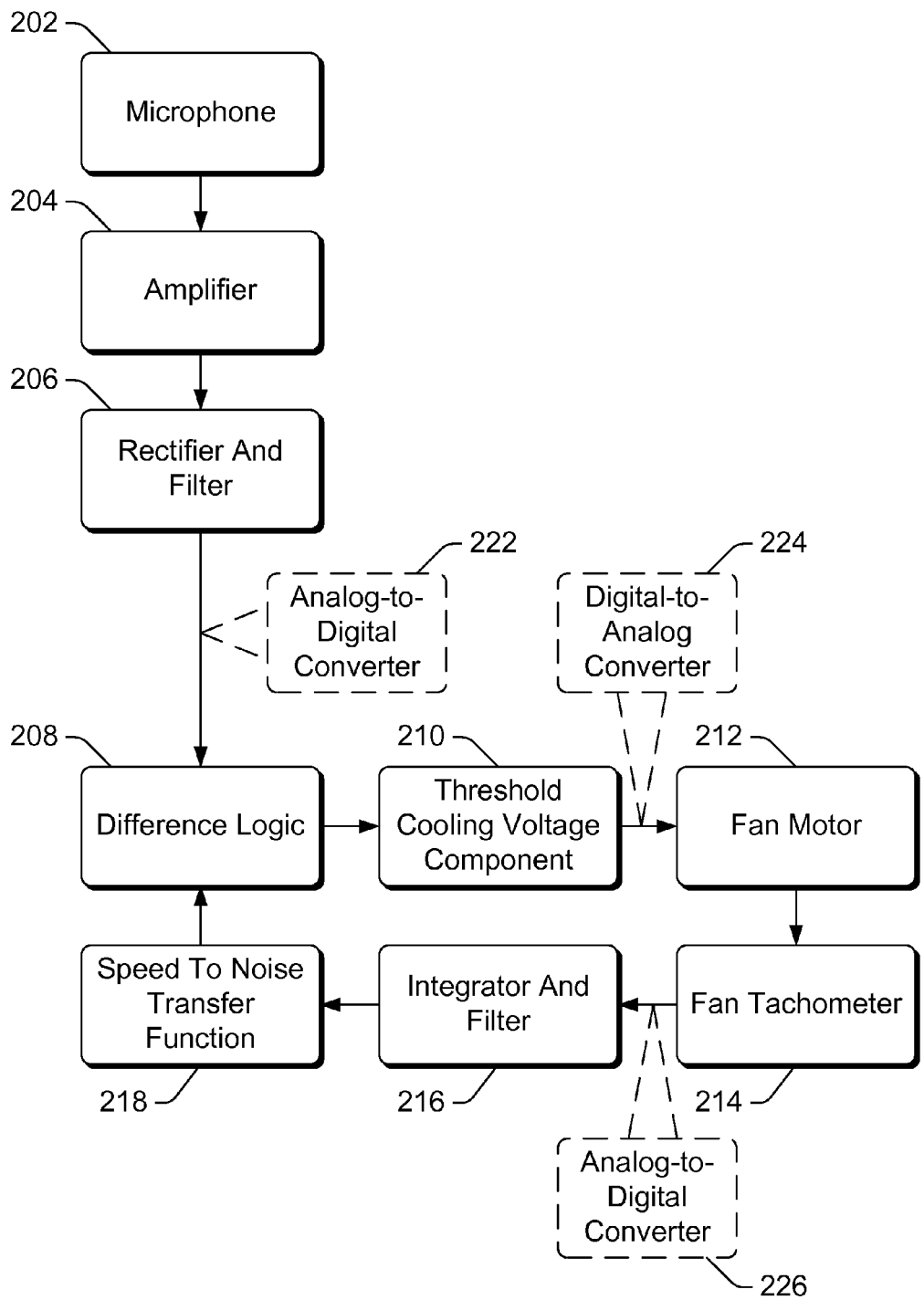
FIG. 2 illustrates an example sensed sound level based fan system in accordance with one or more embodiments.

FIG. 2 illustrates an example sensed sound level based fan system 200 in accordance with one or more embodiments. System 200 can be, for example, a sensed sound level based fan system 104 of FIG. 1. System 200 includes various components, including a microphone 202, an amplifier 204, a rectifier and filter 206, a difference logic 208, a threshold cooling voltage component 210, a fan motor 212, a fan tachometer 214, an integrator and filter 216, and a speed to noise transfer function 218. Although various different individual components 202-214 are illustrated, alternatively the functionality of multiple ones of components 202-214 can be combined into a single component and/or the functionality of one or more components 202-214 can be separated into multiple components. Components 202-214 can be implemented in software, firmware, hardware, or combinations thereof.

Microphone 202 senses sounds for system 200. Microphone 202 senses or otherwise picks up various sounds, such as fan noise, people's voices, ambient noise, and so forth. These sensed sounds are provided by microphone 202 as audio data to amplifier 204. This audio data includes the sound level of sounds sensed by microphone 202, which refers to the power or intensity (e.g., in decibels) of the sounds sensed by microphone 202. Microphone 202 can be a built-in microphone of a device (e.g., a computing device 102 of FIG. 1) that includes system 200. Microphone 202 can alternatively be an external microphone that is coupled to a device (e.g., a computing device 102 of FIG. 1) that includes system 200.

Amplifier 204 amplifies the analog signals sensed by microphone 202 as the audio data for system 200. Microphone 202 and amplifier 204 can be implemented using any of a variety of publicly available and/or proprietary techniques. The amplified analog signals are provided to rectifier and filter 206, and can also be provided to various other modules or components of a device including system 200. For example, the amplified analog signals can be converted to digital analog signals using an analog-to-digital converter, and the digital analog signals provided to a program module (e.g., program module 106 of FIG. 1) as the audio input for the program module.

The amplified signal includes sounds at various frequencies, and rectifier and filter 206 allows audio data of only particular frequency ranges to be provided to difference logic 208. Audio data received by microphone 202 that is not included in those particular frequency ranges is not provided to difference logic 208. Rectifier and filter 206 can be implemented using any of a variety of publicly available and/or proprietary techniques. The frequency ranges provided to difference logic 208 by rectifier and filter 206 include one or more frequency ranges that are used by or are otherwise of interest to a program module (e.g., program module 106 of FIG. 1). For example, if the program module records and/or transmits human speech, then the one or more frequency ranges that are used by the program module are those frequencies that include human speech (e.g., 300-3000 hertz (Hz)).

In one or more embodiments, rectifier and filter 206 includes a band-pass filter that allows through to difference logic 208 only frequencies in a particular one or more ranges of frequencies (e.g., 300-3000 Hz). Alternatively, rectifier and filter 206 can include other types of filters. For example, rectifier and filter 206 can be a low-pass filter that allows through to difference logic 208 frequencies of less than a particular threshold (e.g., approximately 3000 Hz).

Difference logic 208 receives the particular frequencies of audio data from rectifier and filter 206. Difference logic 208 also receives from speed to noise transfer function 218 an indication of the amount of noise (e.g., a sound level) that the fan is generating at its current speed. The manner in which this indication of the amount of noise is generated by speed to noise transfer function 218 is discussed in more detail below.

Thus, difference logic 208 receives the sound level of sounds in the particular frequencies that are sensed by microphone 202 and passed through by rectifier and filter 206. Difference logic 208 also receives the sound level of the fan at its current speed. Given the sensed sound level and the sound level of the fan, difference logic 208 can readily determine the sensed sound level that is not attributable to the fan. In effect, difference logic 208 can remove from the sensed sound level the sound level that is attributable to the fan.

Difference logic 208 determines the sensed sound level that is not attributable to the fan by subtracting from the sensed sound level the sound level of the fan, as indicated by speed to noise transfer function 218. The sound level of the fan can be subtracted from the sensed sound level in different manners, such as using logarithmic subtraction in situations in which the sound levels are measured in decibels.

Difference logic 208 uses the sensed sound level that is not attributable to the fan to generate a control signal that is an indication of the voltage to be supplied to fan motor 212. Generally, the higher the sound level that is not attributable to the fan, the greater the voltage that can be supplied to fan motor 212 and thus the faster that fan motor 212 runs. Difference logic 208 can generate this control signal in various manners. In one or more embodiments, the control signal is generated by mapping a sound level (the sensed sound level that is not attributable to the fan) to a particular voltage. This mapping can be a linear mapping or other non-linear mapping. The voltage that a particular sound level is mapped to is a voltage causing a speed of fan motor 212 to result in a sound level of the fan that is less than the sensed sound level that is not attributable to the fan.

This mapping can be determined in different manners, such as empirically for each type of device. For example, in a controlled environment (e.g., a soundproof room) the sound level that the fan generates when various different voltages are supplied to fan motor 212 can be determined. The mapping can include these determined sound levels each corresponding to a voltage that is a particular amount (e.g., 5% or 0.2 volts) less than the voltage supplied to fan motor 212 resulting in that sound level. For example, if supplying 3.5 volts to fan motor 212 is determined to result in a sound level of the fan that is 63 decibels (dB), then the mapping can indicate that if the sensed sound level that is not attributable to the fan is 63 decibels (dB) then the indicated voltage is to be 3.3 volts. Alternatively, the sound level that the fan generates when various different voltages are applied to fan motor 212 can be determined in other manners, such as estimates or approximations based on the sound level generated by other fans, estimates or approximations based on the sound level generated by the fan running in another type of device, and so forth Alternatively, rather than mapping a sound level to a particular voltage, the control signal can be incremented or decremented by a particular amount. This particular amount can be a fixed amount (e.g., a particular number of millivolts) or a variable amount (e.g., 5% of the current voltage indicated by the control signal). For example, if the sensed sound level that is not attributable to the fan is greater than the sound level of the fan then the control signal is incremented by the particular amount, and if the sensed sound level that is not attributable to the fan is less than or equal to the sound level of the fan then the control signal is decremented by the particular amount.

Difference logic 208 outputs the control signal, which is a signal at a particular voltage, to threshold cooling voltage component 210. Threshold cooling voltage component 210 identifies a threshold voltage that the voltage supplied to fan motor 212 is not to drop below. Threshold cooling voltage component 210 provides to fan motor 212 the greater of the threshold voltage and the control signal at the particular voltage received from difference logic 208. Thus, although the control signal received from difference logic 208 may drop below the threshold cooling voltage, the voltage provided to fan motor 212 does not drop below the threshold voltage.

The threshold cooling voltage can be determined in a variety of different manners. In one or more embodiments, the threshold cooling voltage is a voltage desired by a designer or distributor of system 200. In other embodiments, the threshold cooling voltage is variable depending on the performance of the device including system 200. For example, the threshold cooling voltage may vary based on the orientation of the device including system 200, based on the speed at which one or more processors of the device including system 200 are operating, based on the heat generated by one or more processors of the device including system 200, and so forth. In such situations, one or more components of the device including system 200 can change the threshold cooling voltage based on the performance of the device.

In one or more embodiments, fan motor 212 is a voltage controlled motor that moves the blades of the fan. The fan typically includes both the blades as well as fan motor 212. The higher the voltage provided to fan motor 212, the faster the fan motor runs (and thus the faster the fan blades move, providing increased cooling and sound). The lower the voltage provided to fan motor 212, the slower the fan motor runs (and thus the slower the fan blades move, providing decreased cooling and sound).

In other embodiments, fan motor 212 can be controlled in other manners. For example, fan motor 212 can be controlled using pulse width modulation (PWM). In such situations, the duty cycle of the control signal provided by difference logic 208 and threshold cooling voltage component 210 is used to control the speed of the fan motor, with higher duty cycles of the control signal resulting in faster fan speeds than lower duty cycles. Difference logic 208 can generate a control signal in various manners (e.g., mapping a sound level to a particular duty cycle, incrementing or decrementing the duty cycle by a particular amount, etc.), and component 210 identifies a threshold duty cycle that the control signal supplied to fan motor 212 is not to drop below. For example, component 210 provides to fan motor 212 a control signal with a duty cycle that is the greater of the threshold duty cycle and the duty cycle of the control signal received from difference logic 208.

Fan tachometer 214 identifies the speed at which fan motor 212 is running (e.g., in revolutions per minute). Fan tachometer 214 is typically included as part of fan motor 212, but may alternatively be implemented separately from fan motor 212.

Integrator and filter 216 receives an indication of the speed detected by fan tachometer 214. Integrator and filter 216 determines a modified speed indication based at least in part on the indication of the speed at which fan motor 212 is running as received from fan tachometer 214, and provides this modified speed indication to speed to noise transfer function 218. Integrator and filter 216 determines the modified speed indication so that rapid changes in the speed at which fan motor 212 is running are smoothed or otherwise not reflected as rapidly in the modified speed indication provided to speed to noise transfer function 218.

Integrator and filter 216 can determine the modified speed indication in various manners. In one or more embodiments, integrator and filter 216 averages the indications of speed received from fan tachometer 214. This averaging can be implemented in different manners, such as averaging all of the received speed indications over an amount of time (e.g., 5-10 seconds), performing a weighted averaging of speed indications (e.g., where less recently received speed indications factor into the modified speed indication less than more recently received speed indications) over an amount of time (e.g., 5-10 seconds), and so forth. The amount of time over which the received speed indications are averaged can vary, and can optionally be a configurable value (e.g., configurable by a user or administrator of system 200, configurable by a designer or distributor of devices including system 200, and so forth).

Alternatively, integrator and filter 216 can determine the modified speed indication in other manners. For example, integrator and filter 216 can apply various rules and/or criteria to determine when the modified speed indication is to change based on the indications of speed received from fan tachometer 214. For example, integrator and filter 216 can determine that the modified speed indication is to change to the indicated speed received from fan tachometer 214 only if the indicated speed received from tachometer 214 remains at a particular speed (e.g., the same speed) for a threshold amount of time. By way of another example, integrator and filter 216 can determine that the modified speed indication is to change to the indicated speed received from fan tachometer 214 only if the indicated speed received from tachometer 214 remains at least a threshold amount greater than (or less than) the current modified speed indication for a threshold amount of time.

Speed to noise transfer function 218 determines the sound level or noise of the fan at its current speed, which is the speed indicated by the modified speed indication received from integrator and filter 216. Speed to noise transfer function 218 provides an indication of the sound level of the fan at its current speed to difference logic 208. Speed to noise transfer function 218 can be implemented in various manners, such as a table or mapping of speeds (e.g., as indicated by the modified speed indications received from integrator and filter 216) to sound levels, one or more formulas or functions that convert speeds (e.g., as indicated by the modified speed indications received from integrator and filter 216) to sound levels, and so forth.

The sound level of the fan at any given speed can be determined in different manners. In one or more embodiments, a different speed to noise transfer function 218 is determined for each type of device (e.g., laptop computer, tablet computer, desktop computer, etc.) that includes system 200. The sound level is determined empirically for each type of device, such as by measuring in a controlled environment (e.g., a soundproof room) the sound level of the fan at various different speeds. Alternatively, the sound level of the fan at any given speed can be determined in other manners, such as estimates or approximations based on the sound levels of other fans, estimates or approximations based on the sound levels of the fan when running in another type of device, and so forth.

The speed to noise transfer function can be determined for various different frequency ranges. In one or more embodiments, the speed to noise transfer function is determined for all frequencies that are sensed by microphone 202. Alternatively, the speed to noise transfer function can be determined for only (or approximately) the one or more ranges of frequencies that are passed to difference logic 208 by rectifier and filter 206. Thus, the sound level of the fan in frequency ranges that are not used by the program module (and thus are not passed through to difference logic 208 by rectifier and filter 206) need not be taken into account by speed to noise transfer function 218.

In one or more embodiments, system 200 includes multiple different speed to noise transfer functions that are used in different situations. These different situations include different components being used and/or activated at different times in system 200. For example, these different situations can include which of multiple microphones is being used by the user. A device including system 200 may have multiple microphones situated in different locations of the device or coupled to the device (e.g., one or more microphones may be in a headset coupled to the device). Each microphone, or each combination of microphones can have a different associated speed to noise transfer function, and the appropriate one of the multiple different speed to noise transfer functions is used at any given time based on which microphone or combination of microphones is activated or otherwise being used.

Integrator and filter 216 operates to reduce how quickly the speed of fan motor 212 is changed based on the sound level generated by the fan by determining and providing to speed to noise transfer function 218 the modified speed indication. Alternatively, how quickly the speed of fan motor 212 is changed can be reduced in other manners. For example, the indication of the sound level of the fan provided by speed to noise transfer function 218 can be averaged (or other rules or criteria applied) so that rapid changes in the indication of the sound level of the fan are smoothed or otherwise not reflected as rapidly (analogous to the smoothing of changes in the speed at which fan motor 212 is running as discussed above). By way of another example, the control signal output by difference logic 208 can be averaged (or other rules or criteria applied) so that rapid changes in the control signal are smoothed or otherwise not reflected as rapidly (analogous to the smoothing of changes in the speed at which fan motor 212 is running as discussed above). By way of yet another example, the sound level sensed by microphone 202 can be averaged (or other rules or criteria applied), such as by rectifier and filter 206 or by difference logic 208, so that rapid changes in the sensed sound level are smoothed or otherwise not reflected as rapidly (analogous to the smoothing of changes in the speed at which fan motor 212 is running as discussed above).

Thus, the speed of fan motor 212, and thus of the fan, is adjusted so that the speed is low enough that the noise from the fan does not interfere with the sounds used by the program, such as by keeping the speed of the fan low enough that the sound level of the fan does not exceed the sound level attributable to other non-fan sounds. If the sound level of other non-fan sounds (the sensed sound level that is not attributable to the fan) increases, then the speed of the fan and thus the sound level of the fan is also increased to increase the amount of cooling provided by the fan. However, if the sound level of other non-fan sounds (the sensed sound level that is not attributable to the fan) decreases, then the speed of the fan and thus the sound level of the fan is decreased, although not below a speed corresponding to the threshold cooling voltage as discussed above.

In one or more embodiments, some of components 202-218 are implemented in hardware and others of components 202-218 are implemented in software and/or firmware. In such situations, an analog-to-digital converter is included in system 200 when communicating from a component implemented in hardware to a component implemented in software and/or firmware, and a digital-to-analog converter is included in system 200 when communicating from a component implemented in software and/or firmware to a component implemented in hardware. For example, microphone 202, amplifier 204, rectifier and filter 206, fan motor 212, and fan tachometer 214 may be implemented in hardware and the other components of system 200 implemented in software and/or firmware. Following this example, an analog-to-digital converter 222 can be included to convert the analog audio data from rectifier and filter 206 to digital audio data for difference logic 208, a digital-to-analog converter 224 can be included to convert a digital control signal from threshold cooling voltage component 210 to an analog control signal for fan motor 212, and an analog-to-digital converter 226 can be included to convert an analog indication of the fan speed from fan tachometer 214 to a digital indication of the fan speed for integrator and filter 216.

In one or more embodiments, the output of analog-to-digital converter 222 is provided to a digital filter and scaling module to further filter and scale the particular frequencies of audio data provided by rectifier and filter 206. The digitally filtered and scaled particular frequencies of audio data are output by the digital filter and scaling module and provided to difference logic 208. Additionally, in one or more embodiments, digital-to-analog converter 224 is a PWM controller or modulator that generates a PWM signal to control the speed of fan motor 212. Furthermore, in one or more embodiments analog-to-digital converter 226 is a digital frequency counter that converts the analog indication of the speed at which fan motor 212 is running to a digital indication of the speed at which fan motor 212 is running.

In one or more embodiments, the sensed sound level based fan speed adjustment techniques discussed herein can be used in conjunction with various other noise reduction and/or sound cancellation techniques. For example, a device including system 200 can include or have attached thereto one or more speakers via which noise cancellation signals can be played back. The sound wave generated by the fan at various fan motor speeds can be determined in various manners, analogous to determining the sound level of the fan at various fan motor speeds as discussed above. A sound wave that cancels or reduces the sound generated by the fan (e.g., a sound wave having the same amplitude but inverted phase as the sound wave generated by the fan at a particular speed) can be played back by the device via the one or more speakers.

In one or more embodiments, a device may include multiple fans. In such situations, the control signal output by difference logic 208 can control the speed of the fan motors of each of the multiple fans, as discussed above. Alternatively, each of multiple fans may be controlled by a different one or more microphones. For example, each fan can be associated with one or more microphones, and a different system 200 can be included for each fan and associated one or more microphones. Thus, in this example the speed of the fan motors of the different fans are controlled separately.

Additionally, in some situations a device may include or have coupled thereto multiple microphones. In such situations, the sounds sensed by each of the multiple microphones can be combined in any of a variety of public and/or proprietary manners and provided to amplifier 204 (or to rectifier and filter 206), and the combined sound used by system 200 as the basis for controlling the speed of fan motor 212. Alternatively, the sounds sensed by a single microphone (or subset of microphones) may be selected as the sounds and sound levels to be provided to amplifier 204 (or to rectifier and filter 206). For example, the single microphone (or subset of microphones) that is selected by a user of the device (or program module of the device) may be selected as the microphone (or microphones) to provide sounds to amplifier 204 (or to rectifier and filter 206). By way of another example, the single microphone (or subset of microphones) that is sensing the highest sound level, that is sensing the lowest sound level, that is sensing the averaged (or closest to the average) sound level of the multiple microphones, etc. may be selected as the microphone (or microphones) to provide sounds to amplifier 204 (or to rectifier and filter 206).

The sensed sound level based fan speed adjustment techniques discussed herein support various different usage scenarios. For example, the program module of a device may record the voices of a lecture or question and answer session. The sound level of the voices may vary based on who is speaking, such as a lecturer that is fifty feet away from the device or another person that is two feet away from the device. Assuming the sound level of the person that is two feet away is greater than the sound level of the person that is fifty feet away, the fan can be run at a higher speed when the person that is two feet away is speaking without the sound level from the fan exceeding the sound level of and interfering with the speaker's voice.

By way of another example, the program module of a device may be a video conferencing program that transmits audio data to another video conferencing device. The fan can be run at a higher speed when the user of the device is speaking than when the user of the device is not speaking, relying on the sound level of the user's voice when speaking to exceed the sound level of the fan. Thus, the noise from the fan that is picked up by the microphone does not exceed the sound level of the user and does not interfere with the user's voice that is transmitted to the other video conferencing device.

Figure 3:
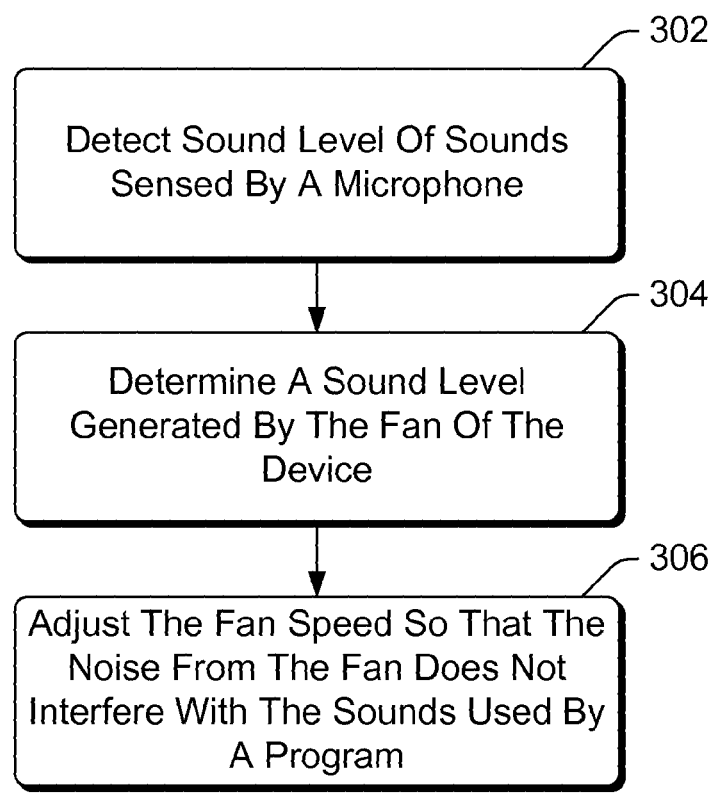
FIG. 3 is a flowchart illustrating an example process for implementing sensed sound level based fan speed adjustment in accordance with one or more embodiments.

FIG. 3 is a flowchart illustrating an example process 300 for implementing sensed sound level based fan speed adjustment in accordance with one or more embodiments. Process 300 is carried out by a sensed sound level based fan system, such as system 104 of FIG. 1 or system 200 of FIG. 2, and can be implemented in software, firmware, hardware, or combinations thereof. Process 300 is shown as a set of acts and is not limited to the order shown for performing the operations of the various acts. Process 300 is an example process for implementing sensed sound level based fan speed adjustment; additional discussions of implementing sensed sound level based fan speed adjustment are included herein with reference to different figures.

In process 300, the sound level of sounds sensed by one or more microphones is detected (act 302). The sounds include sounds in a particular range of frequencies used by a program of the device, with the audio inputs for that program being received via the one or more microphones. These sounds for which sound levels are detected can be, for example, the sounds in particular frequency ranges provided by rectifier and filter 206 of FIG. 2.

A sound level of one or more fans of the device is determined (act 304). A fan can have different sound levels based on its speed, and the sound level of a fan at a particular speed can be determined as discussed above. This sound level of the fan at a particular speed can be, for example, the indication of the amount of noise that the fan is generating at its current speed provided by speed to noise transfer function 218 of FIG. 2.

The speed of the fan is adjusted so that the noise from the fan does not interfere with the sounds used by the program (act 306). This adjustment can be, for example, adjusting the speed of the fan motor so that the sound level of the fan is less than a sound level sensed by the microphone that is attributable to sounds other than fan noise. This adjustment can be performed by, for example, difference logic 208 and threshold cooling voltage component 210 of FIG. 2.

Various actions such as communicating, receiving, recording, storing, generating, obtaining, and so forth performed by various components or modules are discussed herein. A particular component or module discussed herein as performing an action includes that particular component or module itself performing the action, or alternatively that particular component or module invoking or otherwise accessing another component or module that performs the action (or performs the action in conjunction with that particular component or module). Thus, a particular component or module performing an action includes that particular component or module itself performing the action and/or another component or module invoked or otherwise accessed by that particular component or module performing the action.

Figure 4:
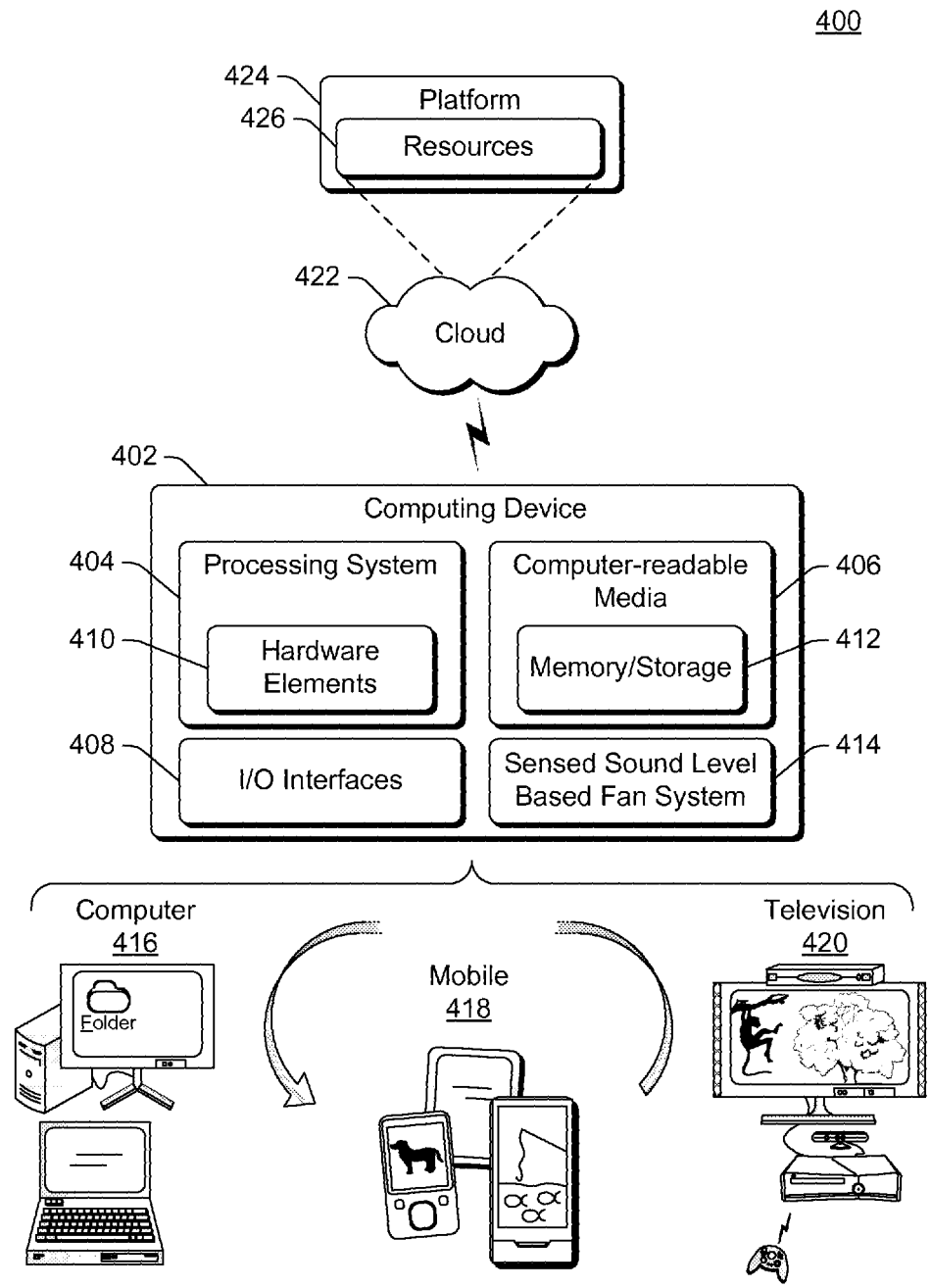
FIG. 4 illustrates an example system that includes an example computing device that is representative of one or more systems and/or devices that may implement the various techniques described herein.

FIG. 4 illustrates an example system generally at 400 that includes an example computing device 402 that is representative of one or more systems and/or devices that may implement the various techniques described herein. The computing device 402 may be, for example, a server of a service provider, a device associated with a client (e.g., a client device), an on-chip system, and/or any other suitable computing device or computing system.

The example computing device 402 as illustrated includes a processing system 404, one or more computer-readable media 406, and one or more I/O Interfaces 408 that are communicatively coupled, one to another. Although not shown, the computing device 402 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 404 is representative of functionality to perform one or more operations using hardware. Accordingly, the processing system 404 is illustrated as including hardware elements 410 that may be configured as processors, functional blocks, and so forth. This may include implementation in hardware as an application specific integrated circuit or other logic device formed using one or more semiconductors. The hardware elements 410 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable media 406 is illustrated as including memory/storage 412. The memory/storage 412 represents memory/storage capacity associated with one or more computer-readable media. The memory/storage 412 may include volatile media (such as random access memory (RAM)) and/or nonvolatile media (such as read only memory (ROM), Flash memory, optical disks, magnetic disks, and so forth). The memory/storage 412 may include fixed media (e.g., RAM, ROM, a fixed hard drive, and so on) as well as removable media (e.g., Flash memory, a removable hard drive, an optical disc, and so forth). The computer-readable media 406 may be configured in a variety of other ways as further described below.

Input/output interface(s) 408 are representative of functionality to allow a user to enter commands and information to computing device 402, and also allow information to be presented to the user and/or other components or devices using various input/output devices. Examples of input devices include a keyboard, a cursor control device (e.g., a mouse), a microphone (e.g., for voice inputs), a scanner, touch functionality (e.g., capacitive or other sensors that are configured to detect physical touch), a camera (e.g., which may employ visible or non-visible wavelengths such as infrared frequencies to detect movement that does not involve touch as gestures), and so forth. Examples of output devices include a display device (e.g., a monitor or projector), speakers, a printer, a network card, tactile-response device, and so forth. Thus, the computing device 402 may be configured in a variety of ways as further described below to support user interaction.

Computing device 402 also includes a sensed sound level based fan system 414. Sensed sound level based fan system 414 includes one or more cooling fans that operate at various speeds and that are adjusted so that the desired cooling level is attained while keeping the fan speed low enough that the noise from the fan does not interfere with the sounds used by one or more programs of system 400 (e.g., keeping the fan speed low enough that the sound level of the fan does not exceed the sound level attributable to other non-fan sounds), as discussed above. Sensed sound level based fan system 414 can implement, for example, system 104 of FIG. 1 and/or system 200 of FIG. 2.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 402. By way of example, and not limitation, computer-readable media may include "computer-readable storage media" and "computer-readable signal media."

"Computer-readable storage media" refers to media and/or devices that enable persistent storage of information and/or storage that is tangible, in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" refers to a signal-bearing medium that is configured to transmit instructions to the hardware of the computing device 402, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 410 and computer-readable media 406 are representative of instructions, modules, programmable device logic and/or fixed device logic implemented in a hardware form that may be employed in some embodiments to implement at least some aspects of the techniques described herein. Hardware elements may include components of an integrated circuit or on-chip system, an application-specific integrated circuit (ASIC), a field-programmable gate array (FPGA), a complex programmable logic device (CPLD), and other implementations in silicon or other hardware devices. In this context, a hardware element may operate as a processing device that performs program tasks defined by instructions, modules, and/or logic embodied by the hardware element as well as a hardware device utilized to store instructions for execution, e.g., the computer-readable storage media described previously.

Combinations of the foregoing may also be employed to implement various techniques and modules described herein. Accordingly, software, hardware, or program modules and other program modules may be implemented as one or more instructions and/or logic embodied on some form of computer-readable storage media and/or by one or more hardware elements 410. The computing device 402 may be configured to implement particular instructions and/or functions corresponding to the software and/or hardware modules. Accordingly, implementation of modules as a module that is executable by the computing device 402 as software may be achieved at least partially in hardware, e.g., through use of computer-readable storage media and/or hardware elements 410 of the processing system. The instructions and/or functions may be executable/operable by one or more articles of manufacture (for example, one or more computing devices 402 and/or processing systems 404) to implement techniques, modules, and examples described herein.

As further illustrated in FIG. 4, the example system 400 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 400, multiple devices are interconnected through a central computing device. The central computing device may be local to the multiple devices or may be located remotely from the multiple devices. In one or more embodiments, the central computing device may be a cloud of one or more server computers that are connected to the multiple devices through a network, the Internet, or other data communication link.

In one or more embodiments, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one or more embodiments, a class of target devices is created and experiences are tailored to the generic class of devices. A class of devices may be defined by physical features, types of usage, or other common characteristics of the devices.

In various implementations, the computing device 402 may assume a variety of different configurations, such as for computer 416, mobile 418, and television 420 uses. Each of these configurations includes devices that may have generally different constructs and capabilities, and thus the computing device 402 may be configured according to one or more of the different device classes. For instance, the computing device 402 may be implemented as the computer 416 class of a device that includes a personal computer, desktop computer, a multi-screen computer, laptop computer, netbook, and so on.

The computing device 402 may also be implemented as the mobile 418 class of device that includes mobile devices, such as a mobile phone, portable music player, portable gaming device, a tablet computer, a multi-screen computer, and so on. The computing device 402 may also be implemented as the television 420 class of device that includes devices having or connected to generally larger screens in casual viewing environments. These devices include televisions, set-top boxes, gaming consoles, and so on.

The techniques described herein may be supported by these various configurations of the computing device 402 and are not limited to the specific examples of the techniques described herein. This functionality may also be implemented all or in part through use of a distributed system, such as over a "cloud" 422 via a platform 424 as described below.

The cloud 422 includes and/or is representative of a platform 424 for resources 426. The platform 424 abstracts underlying functionality of hardware (e.g., servers) and software resources of the cloud 422. The resources 426 may include applications and/or data that can be utilized while computer processing is executed on servers that are remote from the computing device 402. Resources 426 can also include services provided over the Internet and/or through a subscriber network, such as a cellular or Wi-Fi network.

The platform 424 may abstract resources and functions to connect the computing device 402 with other computing devices. The platform 424 may also serve to abstract scaling of resources to provide a corresponding level of scale to encountered demand for the resources 426 that are implemented via the platform 424. Accordingly, in an interconnected device embodiment, implementation of functionality described herein may be distributed throughout the system 400. For example, the functionality may be implemented in part on the computing device 402 as well as via the platform 424 that abstracts the functionality of the cloud 422.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method implemented in a device, the method comprising:
   detecting a sound level of sounds sensed by a microphone, the sounds including a particular range of frequencies used by a program of the device, and the program receiving audio inputs in the particular range of frequencies via the microphone;
   determining a sound level of a fan of the device at a current fan speed, the determining comprising using a speed to noise transfer function to identify the sound level generated by the fan of the device at the current fan speed; and
   adjusting a speed of the fan so that the sound level of the fan is less than a sound level sensed by the microphone that is attributable to sounds other than fan noise.

2. A method as recited in claim 1, the adjusting further comprising adjusting the speed of the fan to run at at least a threshold speed to provide a desired amount of cooling regardless of the sound level of the fan.

3. A method as recited in claim 1, the adjusting further comprising reducing how quickly the speed of the fan is adjusted in response to changes in sound level of the fan.

4. A method as recited in claim 3, the reducing how quickly the speed of the fan is adjusted in response to changes in sound level of the fan comprising averaging the current fan speed over an amount of time.

5. A method as recited in claim 3, the reducing how quickly the speed of the fan is adjusted in response to changes in sound level of the fan comprising averaging an indication of the sound level of the fan over an amount of time.

6. A method as recited in claim 3, the reducing how quickly the speed of the fan is adjusted in response to changes in sound level of the fan comprising averaging a value of a control signal indicating a voltage to apply to a motor of the fan over an amount of time.

7. A method as recited in claim 1, the program comprising a program to record voices at the device, the particular range of frequencies comprising frequencies that are recorded by the program.

8. A method as recited in claim 1, the program comprising a video conferencing program that transmits voices to an additional device, the particular range of frequencies comprising frequencies that are transmitted to the additional device.

9. A method as recited in claim 1, further comprising playing back, via one or more speakers of the device, a sound wave that cancels at least part of the sound level of the fan.

10. A method as recited in claim 1, the speed to noise transfer function being determined for only the particular range of frequencies used by the program.

11. A method as recited in claim 1, the determining further comprising selecting one of multiple different speed to noise transfer functions to identify the sound level of the fan of the device at the current fan speed, each of the multiple different speed to noise transfer functions being associated with a different one of multiple microphones of the device, the selecting comprising selecting the speed to noise transfer function associated with an activated one of the multiple microphones.

12. A method as recited in claim 1, the microphone comprising one of multiple microphones of the device that is sensing a highest sound level, lowest sound level, or averaged sound level of the multiple microphones.

13. The method as recited in claim 1, further comprising:
determining a second sound level of a second fan of the device at a second current fan speed; and
adjusting a speed of the second fan so that the sound level of both of the fans is less than the sound level sensed by the microphone that is attributable to sounds other than fan noise.

14. A system in a device, the system comprising:
a microphone that detects sounds in a particular range of frequencies used by a program of the device;
a fan motor that controls, based on an input voltage, a speed of a fan of the device; and
a difference logic coupled to receive audio data including sounds sensed by the microphone in the particular range of frequencies, the difference logic being configured to determine, based on both a sound level of the sounds sensed by the microphone and a sound level generated by the fan of the device at a current fan speed, a voltage to apply to the fan motor so that a sound level of the fan is less than a sound level sensed by the microphone of sounds other than fan noise, the difference logic being configured to determine the voltage to apply to the fan motor based on a speed to noise transfer function that identifies the sound level generated by the fan of the device at the current fan speed.

15. A system as recited in claim 14, the system further including a threshold cooling voltage to apply to the fan motor so that the speed of the fan provides a desired amount of cooling regardless of the voltage determined by the difference logic.

16. A system as recited in claim 14, the system further including a filter that reduces how quickly the voltage to apply to the fan motor is adjusted in response to changes in the sound level of the fan and/or the sound level of the sounds detected by the microphone.

17. A system as recited in claim 16, the filter being configured to average the current fan speed over an amount of time.

18. A system as recited in claim 14, the speed to noise transfer function identifying the sound level of the fan at various speeds.

19. A system as recited in claim 18, the speed to noise transfer function being determined for only the particular range of frequencies used by the program.

20. A method implemented in a device, the method comprising:
detecting a sound level of sounds sensed by a microphone, the sounds including a particular range of frequencies used by a program of the device, and the program receiving audio inputs in the particular range of frequencies via the microphone;
determining a sound level of a fan of the device at a current fan speed, the determining including using a speed to noise transfer function to identify the sound level generated by the fan of the device at the current fan speed in the particular range of frequencies used by the program, the determining further including selecting one of multiple different speed to noise transfer functions to identify the sound level of the fan of the device at the current fan speed, each of the multiple different speed to noise transfer functions being associated with a different one of multiple microphones of the device, the selecting comprising selecting the speed to noise transfer function associated with an activated one of the multiple microphones; and
adjusting a speed of the fan so that the sound level of the fan is less than a sound level sensed by the microphone that is attributable to sounds other than fan noise, and reducing how quickly the speed of the fan is adjusted by averaging the current fan speed over an amount of time.

21. A device comprising:
a microphone configured to detect sounds in a particular range of frequencies;
a fan motor configured to control, based on an input voltage, a speed of a fan; and
a circuit configured to receive audio data including sounds sensed by the microphone in the particular range of frequencies, the circuit being configured to determine, based on both a sound level of the sounds sensed by the microphone and a sound level generated by the fan at a current fan speed, a voltage to apply to the fan motor so that a sound level of the fan is less than a sound level sensed by the microphone of sounds other than fan noise, and based on a speed to noise transfer function that identifies the sound level generated by the fan at the current fan speed.

\* \* \* \* \*